United States Patent
Sheng et al.

(10) Patent No.: US 9,147,654 B2
(45) Date of Patent: Sep. 29, 2015

(54) INTEGRATED CIRCUIT SYSTEM EMPLOYING ALTERNATING CONDUCTIVE LAYERS

(75) Inventors: Haifeng Sheng, Singapore (SG); Fan Zhang, Singapore (SG); Juan Boon Tan, Singapore (SG); Bei Chao Zhang, Singapore (SG); Dong Kyun Sohn, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 633 days.

(21) Appl. No.: 12/168,816

(22) Filed: Jul. 7, 2008

(65) Prior Publication Data

US 2010/0001370 A1 Jan. 7, 2010

(51) Int. Cl.
*H01L 23/48* (2006.01)
*H01L 21/4763* (2006.01)
*H01L 23/522* (2006.01)

(52) U.S. Cl.
CPC .................................. *H01L 23/5223* (2013.01)

(58) Field of Classification Search
USPC ......... 257/774, 773, 750, 758, 784, 786, 700, 257/734, 730, 532, E21.585, E27.011
See application file for complete search history.

(56) References Cited

U.S. PATENT DOCUMENTS

| 7,224,060 B2* | 5/2007 | Zhang et al. .................. 257/730 |
| 7,235,864 B2* | 6/2007 | Lee ............................... 257/620 |
| 7,250,681 B2* | 7/2007 | Matsunaga .................... 257/758 |
| 7,696,607 B2* | 4/2010 | Sano et al. ..................... 257/620 |
| 2004/0084775 A1* | 5/2004 | Sugino et al. ................. 257/758 |
| 2007/0152332 A1 | 7/2007 | Chinthakindi et al. |
| 2007/0241425 A1 | 10/2007 | Lin |

* cited by examiner

*Primary Examiner* — Hoa B Trinh

(57) ABSTRACT

An integrated circuit system that includes: providing a substrate including front-end-of-line circuitry; forming a first conductive level including a first conductive trace over the substrate; forming a second conductive level spaced apart from the first conductive level and including a second conductive trace; and connecting the first conductive level to a third conductive level with a viabar that passes through the second conductive level without contacting the second conductive trace.

20 Claims, 3 Drawing Sheets

INTEGRATED CIRCUIT SYSTEM EMPLOYING ALTERNATING CONDUCTIVE LAYERS

TECHNICAL FIELD

The present invention relates generally to integrated circuits, and more particularly to an integrated circuit system employing alternating conductive layers.

BACKGROUND ART

Integrated circuits find application in many of today's consumer electronics, such as cell phones, video cameras, portable music players, printers, computers, etc. Integrated circuits may include a combination of active devices, passive devices and their interconnections.

Passive devices such as on-chip capacitors are critical components of integrated circuits. These capacitors are used for a variety of purposes including bypass and capacitive matching to analog and radio frequency integrated circuit applications. Recently, back-end-of-line (BEOL) vertical parallel plate capacitors (VPPCAP) with stacked via and inter-digitated co-planar positive and negative horizontal metal structures have emerged as an attractive option for advanced CMOS and BiCMOS RF technologies because conventional planar capacitors such as metal-insulator-metal (MIM) capacitors require extra process steps and masks.

As today's integrated circuits become more complex, multi-level metallization technology (sometimes including more than 8 metallization layers) enables the formation of a VPPCAP structure that can be achieved without the extra process steps and masks common to other on-chip capacitor structures. However, in order to achieve the higher capacitance density (capacitance/area) so desired for these BEOL VPPCAP structures, the finger pitch of the VPPCAP structure must be designed with more and more stringent minimum pitch requirements that sometimes violate VPPCAP design rules.

Unfortunately, the progression of the minimum pitch requirement of these VPPCAP structures is causing process difficulties and long-term reliability problems, such as via protrusions that cause time dependent dielectric breakdown (TDDB) failure, which are rapidly becoming some of the most critical challenges for qualification of such capacitors.

Thus, a need still remains for a reliable integrated circuit system and method of fabrication, wherein the integrated circuit system exhibits improved capacitance density and reliability performance. In view of the ever-increasing commercial competitive pressures, increasing consumer expectations, and diminishing opportunities for meaningful product differentiation in the marketplace, it is increasingly critical that answers be found to these problems. Moreover, the ever-increasing need to save costs, improve efficiencies, and meet such competitive pressures adds even greater urgency to the critical necessity that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides an integrated circuit system including: providing a substrate including front-end-of-line circuitry; forming a first conductive level including a first conductive trace over the substrate; forming a second conductive level spaced apart from the first conductive level and including a second conductive trace; and connecting the first conductive level to a third conductive level with a viabar that passes through the second conductive level without contacting the second conductive trace.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
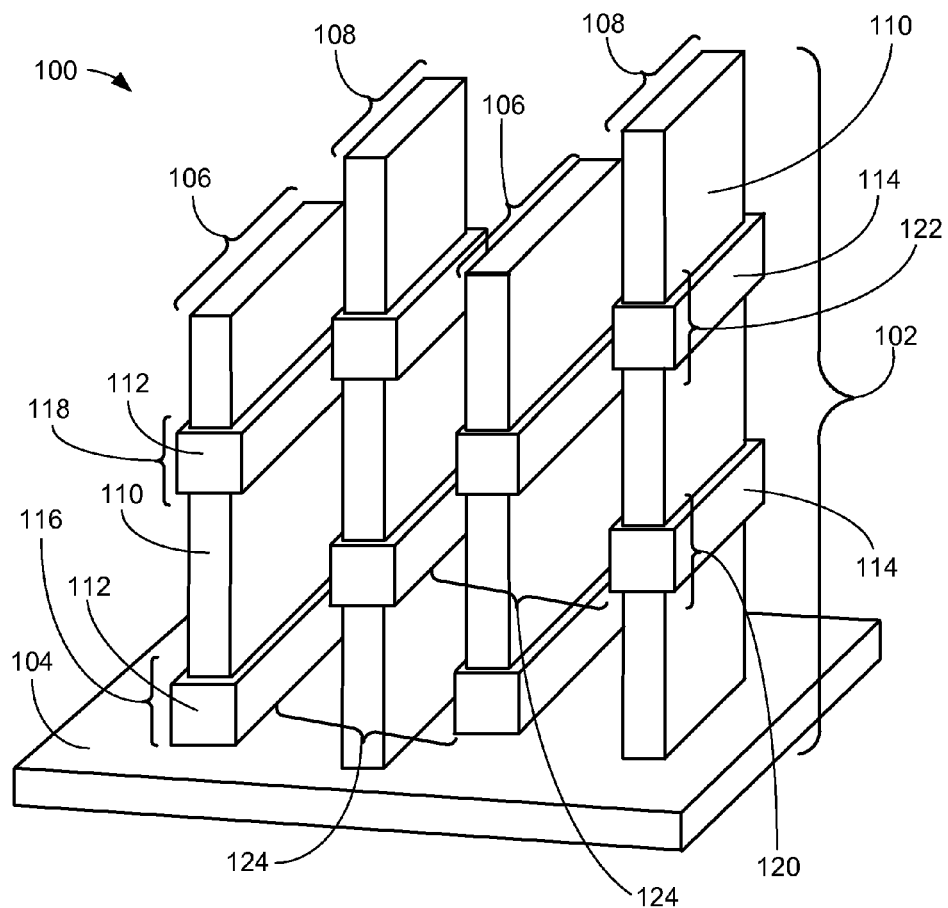
FIG. 1 is an isometric view of an integrated circuit system in a back-end-of-line stage of manufacture in accordance with an embodiment of the present invention.

The following embodiments are described in sufficient detail to enable those skilled in the art to make and use the invention. It is to be understood that other embodiments would be evident based on the present disclosure, and that process or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

Likewise, the drawings showing embodiments of the system are semi-diagrammatic and not to scale and, particularly, some of the dimensions are for the clarity of presentation and are shown exaggerated in the drawing FIGs. Additionally, where multiple embodiments are disclosed and described having some features in common, for clarity and ease of illustration, description, and comprehension thereof, similar and like features one to another will ordinarily be described with like reference numerals.

The term "horizontal" as used herein is defined as a plane parallel to the conventional plane or surface of the substrate, regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane.

The term "processing" as used herein includes deposition of material or photoresist, patterning, exposure, development, etching, cleaning, and/or removal of the material or photoresist as required in forming a described structure.

The term "on" is used herein to mean there is direct contact among elements.

The terms "example" or "exemplary" are used herein to mean serving as an instance or illustration. Any aspect or embodiment described herein as an "example" or as "exemplary" is not necessarily to be construed as preferred or advantageous over other aspects or designs.

The terms "first", "second", "third", "fourth", "fifth", "sixth", and "seventh" as used herein are for purposes of differentiation between elements only and are not to be construed as limiting the scope of the present invention.

The term "viabar" is used herein to mean a via having a horizontal via length at least twice as long as a horizontal via width.

The term "system" as used herein means and refers to the method and to the apparatus of the present invention in accordance with the context in which the term is used.

Generally, the following embodiments relate to the formation of an integrated circuit system including a back-end-of-line (BEOL) vertical parallel plate capacitor (VPPCAP) structure employing vertically alternating conductive layers of opposite polarity. By employing the system and method of the present embodiments, the capacitance density of a VPPCAP structure can be increased because sub-design rule spacing between the conductive elements within each conductive layer can be employed.

FIGS. 1-6, which follow, depict by way of example and not by limitation, an exemplary process flow for the formation of BEOL conductive layers within an integrated circuit system and they are not to be construed as limiting. It is to be understood that a plurality of conventional processes that are well known within the art and not repeated herein, may precede or follow FIGS. 1-6. Moreover, it is to be understood that many modifications, additions, and/or omissions may be made to the below described process without departing from the scope of the claimed subject matter. For example, the below described process may include more, fewer, or other steps. Additionally, steps may be performed in any suitable order without departing from the scope of the present invention.

Referring now to FIG. 1, therein is shown an isometric view of an integrated circuit system 100 in a back-end-of-line stage of manufacture in accordance with an embodiment of the present invention. In some embodiments, the integrated circuit system 100 may include a VPPCAP structure 102 formed by BEOL conductive layers, such as layers M1-Mx where x may equal a positive integer greater than one (1), wherein alternating (e.g., even numbered layers) conductive layers are vertically stacked and interconnected with viabars.

The integrated circuit system 100 may include the VPPCAP structure 102, a substrate 104, a first conductive plate 106 and a second conductive plate 108.

Generally, the substrate 104 represents the portion of the integrated circuit system 100 formed by front-end-of-line (FEOL) processing steps (e.g., deposition, masking, etching, implantation, etc.). As is well known in the art, FEOL processing typically forms active and/or passive circuitry/components on, over, and/or within the substrate 104. As such, it will be appreciated by those skilled in the art that the substrate 104 of the present disclosure may include any number of active device structures, passive device structures, or combinations thereof. Accordingly, the integrated circuit system 100 may include electrical circuits such as, but not limited to, processor components, memory components, logic components, digital components, analog components, mixed-signal components, power components, radio-frequency (RF) components (e.g., RF CMOS circuits), digital signal processor components, micro-electromechanical components, optical sensor components, and so forth, in numerous configurations and arrangements as may be needed. Additionally, it is to be understood that one or more of the integrated circuit system 100 could be prepared at one time on, over, and/or within the substrate 104, which could be separated into individual or multiple integrated circuit assemblies at a later stage of fabrication.

Generally, the first conductive plate 106 and the second conductive plate 108 are formed by BEOL processing steps, such as deposition of conductive materials and dielectrics to create alternating horizontally planar conductive layers of opposite polarity interconnected by vias. By way of example, the first conductive plate 106 and the second conductive plate 108 can be formed by a damascene process and/or a subtractive etching process. It will be appreciated by those skilled in the art that each of the first conductive plate 106 and the second conductive plate 108 can be separated by a dielectric material (not shown).

In some embodiments, the first conductive plate 106 may include an interconnect 110 and a first conductive trace 112, while the second conductive plate 108 may include the interconnect 110 and a second conductive trace 114. Generally, each of the first conductive trace 112 and the second conductive trace 114 are vertically interconnected by the interconnect 110, respectively, to adjacent (e.g., above and below) horizontally planar layers of the first conductive trace 112 and the second conductive trace 114. By way of example, the first conductive trace 112 and the second conductive trace 114 can be made from a material that offers a low resistance to the passage of electrical current, such as a metal, a semiconducting material, or a combination thereof.

Although, the present embodiment depicts a certain number of the first conductive trace 112 and the second conductive trace 114 formed within each horizontally planar layer, it is to be understood that the present embodiment described herein is not restricted to this specific embodiment and it will be readily apparent that more or less of the first conductive trace 112 or the second conductive trace 114 within each horizontally planar layer may be practiced within the teachings herein, and one skilled in the art may readily form alternative embodiments with different numbers and combinations of the first conductive trace 112 and the second conductive trace 114.

It is to be understood that each of the first conductive trace 112 within the first conductive plate 106 can be connected to a first terminal (not shown for purposes of clarity) and that each of the second conductive trace 114 within the second conductive plate 108 can be connected to a second terminal (not shown for purposes of clarity). In some embodiments, the first terminal and the second terminal can define a capacitive structure with vertically and horizontally offset alternating conductive layers of positive and negative electrodes therebetween.

It will be appreciated by those skilled in the art that the first conductive plate 106 may possess a first polarity (e.g., negative or positive) and the second conductive plate 108 may possess a second polarity that is opposite of the first polarity. The first terminal, the second terminal, the first conductive plate 106, and the second conductive plate 108 can be made from a material that offers a low resistance to the passage of electrical current, such as a metal, a semiconducting material, or a combination thereof.

Generally, the interconnect 110 can be constructed as a solid and continuous via, such as a viabar, that possesses a horizontal via length at least twice as long as a horizontal via width. By forming the interconnect 110 to possess a horizontal via length at least twice as long as a horizontal via width, the total area of the interconnect 110 can be increased, the resistance of the interconnect 110 can be lowered, and the effective capacitor plate area of the VPPCAP structure 102 can be increased, thereby improving the reliability of the VPPCAP structure 102. Furthermore, it will be appreciated by those skilled in the art that a viabar configuration of the interconnect 110 permits application of a selective data preparation program that effectively improves the top-profile of the interconnect 110 while increasing the total area of the interconnect 110, thereby helping to prevent via open issues during etching.

It will be appreciated by those skilled in the art that the interconnect 110 can be made from a material that offers a low resistance to the passage of electrical current, such as a metal, a semiconducting material, or a combination thereof.

The interconnect 110 can provide a connection, such as a physical and/or electrical connection, between each of the first conductive trace 112 within the first conductive plate 106 and between each of the second conductive trace 114 within the second conductive plate 108. As such, the interconnect 110 which connects vertically adjacent ones of the first conductive trace 112 passes through a layer of the second conductive trace 114 without contacting the second conductive trace 114, while the interconnect 110 which connects vertically adjacent ones of the second conductive trace 114 passes through a layer of the first conductive trace 112 without contacting the first conductive trace 112.

In some embodiments, the first conductive plate 106 may include a first conductive level 116 and a third conductive level 118 formed from the interconnect 110 and the first conductive trace 112, while the second conductive plate 108 may include a second conductive level 120 and a fourth conductive level 122 formed from the interconnect 110 and the second conductive trace 114. Generally, each of the horizontally conductive layers are vertically spaced apart from and horizontally offset from the adjacent horizontally conductive layer, so that conductive elements within a conductive layer do not overlap when viewed from above.

For example, the second conductive level 120 can be vertically spaced apart from and horizontally offset from the first conductive level 116, so as to not be formed thereover the first conductive level 116. In some embodiments, each of the first conductive level 116, the second conductive level 120, the third conductive level 118, and the fourth conductive level 122 can be vertically separated by a distance of about ten (10) nanometers to about one thousand (1000) nanometers from the other, and the first conductive level 116 and the third conductive level 118 can be horizontally offset from the second conductive level 120 and the fourth conductive level 122 by a distance of about ten (10) nanometers to about one thousand (1000) nanometers, for example.

In some embodiments, the first conductive level 116 can be spaced apart from and in electrical contact with the substrate 104 and/or it can be in electrical contact with another conductive layer. As such, although the present embodiment only depicts the first conductive level 116, the second conductive level 120, the third conductive level 118, and the fourth conductive level 122, it is to be understood that more or less of these conductive layers could be formed above, below and/or in-between the first conductive level 116, the second conductive level 120, the third conductive level 118, and the fourth conductive level 122. Additionally, it is to be understood that each of the first conductive level 116, the second conductive level 120, the third conductive level 118, and the fourth conductive level 122 can be separated by a dielectric material (not shown for purposes of clarity).

Since, the first conductive level 116 and the third conductive level 118 each only possess conductive elements such as the first conductive trace 112 and the interconnect 110, adjacent ones of the first conductive trace 112 within the first conductive level 116 and/or the third conductive level 118 are only separated horizontally by the interconnect 110. By not forming the second conductive trace 114 within the first conductive level 116 and the third conductive level 118, the capacitance density of the integrated circuit system 100 can be increased because the width of the interconnect 110 can be substantially less than the width of the second conductive trace 114. By way of example, the width of the interconnect 110 can be about ten (10) percent to about one-hundred (100) percent of the width of the second conductive trace 114.

As an exemplary illustration, a conventional 32 nanometer process node with horizontally alternating and adjacent positive and negative 50 nanometer wide conductive traces, within the same conductive layer, at a minimum separation space of 50 nanometer would require at least a 200 nanometer pitch between conductive traces of the same polarity, whereas each of the first conductive trace 112 within the first conductive level 116 and/or the third conductive level 118 of the present embodiments could be formed with a pitch or a spacing 124 of 170 nanometer or less. By way of example, in some embodiments, the spacing 124 between each of the first conductive trace 112 within the first conductive level 116 and/or the third conductive level 118 could be between about 50 nanometers to about 150 nanometers.

However, it is to be understood that the minimum width of each of the first conductive trace 112 within the first conductive level 116 and/or the third conductive level 118, as well as the minimum dimension of the spacing 124, are only to be limited by the current processing technology for forming capacitive structures.

Per the present embodiments, the spacing 124 between each of the first conductive trace 112 of the present embodiments can be decreased over that of a conductive layer including both the first conductive trace 112 and the second conductive trace 114. Accordingly, it will be appreciated by those skilled in the art that the density of the first conductive trace 112 within each of the first conductive level 116 and/or the third conductive level 118 can be significantly increased, thereby permitting further scaling of the VPPCAP structure 102.

Additionally, since the second conductive level 120 and the fourth conductive level 122 each only possess conductive elements such as the second conductive trace 114 and the interconnect 110, adjacent ones of the second conductive trace 114 within the second conductive level 120 and/or the fourth conductive level 122 are only separated horizontally by the interconnect 110. By not forming the first conductive trace 112 within the second conductive level 120 and the fourth conductive level 122, the capacitance density of the integrated circuit system 100 can be increased because the width of the interconnect 110 can be substantially less than the width of the first conductive trace 112. By way of example, the width of the interconnect 110 can be about 10 percent to about one-hundred (100) percent of the width of the first conductive trace 112 as described above.

As an exemplary illustration, a conventional 32 nanometer process node with horizontally alternating and adjacent positive and negative 50 nanometer wide conductive traces, within the same conductive layer, at a minimum separation space of 50 nanometer would require at least a 200 nanometer pitch between conductive traces of the same polarity, whereas each of the second conductive trace 114 within the second conductive level 120 and/or the fourth conductive level 122 of the present embodiments could be formed with the spacing 124 or a pitch of 170 nanometer or less. By way of example, in some embodiments, the spacing 124 between each of the second conductive trace 114 within the second conductive level 120 and/or the fourth conductive level 122 could be between about 50 nanometers to about 150 nanometers.

However, it is to be understood that the minimum width of each of the second conductive trace 114 within the second conductive level 120 and/or the fourth conductive level 122, as well as the minimum dimension of the spacing 124, are only to be limited by the current processing technology for forming capacitive structures.

Per the present embodiments, the spacing 124 between each of the second conductive trace 114 of the present embodiments can be decreased over that of a conductive layer including both the first conductive trace 112 and the second conductive trace 114. Accordingly, it will be appreciated by those skilled in the art that the density of the second conductive trace 114 within the second conductive level 120 and/or the fourth conductive level 122 can be significantly increased, thereby permitting further scaling of the VPPCAP structure 102.

Moreover, the present embodiments also permit the use of sub-design rule spacing when forming the first conductive trace 112 and the second conductive trace 114 without breaking design rules at the layer level for the first conductive level 116, the third conductive level 118, the second conductive level 120, and/or the fourth conductive level 122. The present embodiments achieve the use of sub-design rule spacing by forming each of the first conductive trace 112 and the second conductive trace 114 vertically and horizontally offset from each other (i.e., each of the horizontally conductive layers are vertically spaced apart from and horizontally offset from the adjacent horizontally conductive layer, so that conductive elements within a conductive layer do not overlap when viewed from above).

Stated another way, the present embodiments achieve sub-design rule spacing by forming each of the second conductive trace 114 in-between and over each of the first conductive trace 112, wherein the distance between each of the first conductive trace 112 and the second conductive trace 114, as viewed from above, varies with current sub-design rule spacing process techniques. As such, the first conductive trace 112 can be formed at the first conductive level 116 and/or the third conductive level 118 without breaking the design rules for this layer level, while, the second conductive trace 114 can be formed at the second conductive level 120 and/or the fourth conductive level 122 without breaking the design rules for that layer level.

It will be appreciated by those skilled in the art that the use of sub-design rule spacing permits the distance between the first conductive trace 112 and the second conductive trace 114, when viewed from above, to be smaller than what was previously achieved when using conventional minimum design rule spacing. For example, the distance between the first conductive trace 112 and the second conductive trace 114, when viewed from above, could be less than fifty (50) nanometers at the thirty-two (32) nanometer process node for the present embodiments. It is to be understood that by utilizing the sub-design rule spacing of the present embodiments, the capacitance density (capacitance per unit area) of the integrated circuit system 100 can be increased over that of conventional VPPCAP structures.

Figure 2:
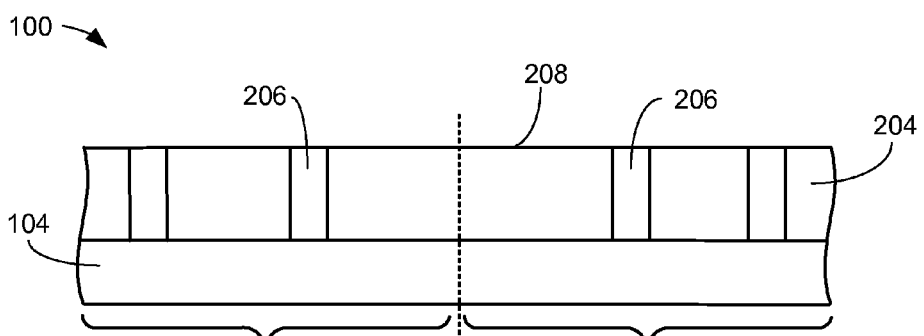
FIG. 2 is a partial cross sectional view of back-end-of-line metallization layers formed within an integrated circuit system during manufacture in accordance with an embodiment of the present invention.

Referring now to FIG. 2, therein is shown a partial cross sectional view of back-end-of-line conductive layers formed within the integrated circuit system 100 during manufacture in accordance with an embodiment of the present invention. The integrated circuit system 100 includes a first region 200, a second region 202, a first dielectric layer 204 and a plug 206.

In some embodiments, the substrate 104 can include the first region 200 with a portion of the integrated circuit system 100 dedicated to the formation of the VPPCAP structure 102, of FIG. 1, and the substrate 104 can include the second region 202 with a portion of the integrated circuit system 100 dedicated to the formation of an interconnect area over a logic region, for example.

Generally, the first dielectric layer 204 can act as a pre-metal dielectric layer, which separates the devices within the substrate 104 from the first conductive level 116, of FIG. 1. By way of example, the first dielectric layer 204 may include any material that electrically isolates and/or prevents the migration of mobile ionic contaminants between the substrate 104 and the BEOL conductive layers formed above the substrate 104. In some embodiments, the first dielectric layer 204 may include a doped silicon oxide or a glass type material. In other embodiments, the first dielectric layer 204 may also include silicon oxide, silicon nitride, or a combination thereof.

The plug 206 provides an electrical pathway from one conductive layer to an adjacent conductive layer or layers. The plug 206 can be strategically placed within the first dielectric layer 204 to form the desired electrical circuits or pathways between appropriate conductive layers. In some embodiments, the plug 206 may electrically connect the first conductive level 116 to the substrate 104, for example. Generally, the plug 206 may include any material that offers a low resistance to the passage of electrical current, such as a metal, a semiconducting material, or a combination thereof. By way of example, in some embodiments, the plug 206 may include tungsten.

It will be appreciated by those skilled in the art that the plug 206 and a top surface 208 of the first dielectric layer 204 can be planarized by a chemical mechanical planarization process, for example.

Figure 3:
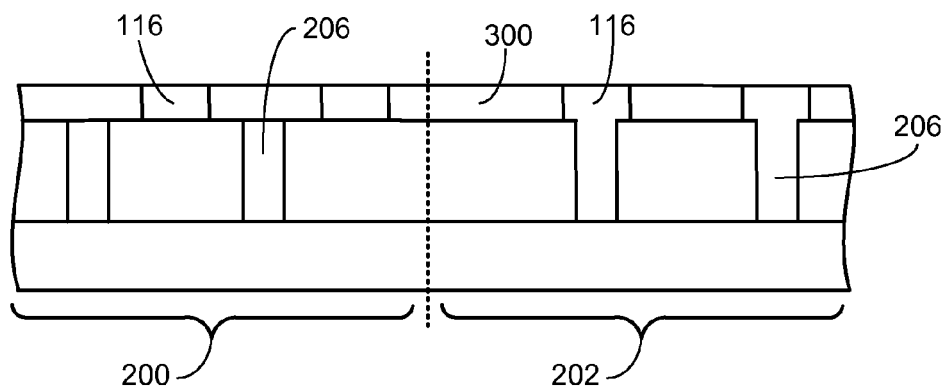
FIG. 3 is the structure of FIG. 2 after forming an M1 level.

Referring now to FIG. 3, therein is shown the structure of FIG. 2 after forming the first conductive level 116. In some embodiments, an additional conductive layer, such as the first conductive level 116 can be formed within a second dielectric layer 300, such as an interlayer dielectric. In such cases, the second dielectric layer 300 may include an oxide, a nitride, or a combination thereof.

Within the first region 200, the first conductive level 116 can be offset from the plug 206 (e.g., not in contact with the plug 206) and within the second region 202, the first conductive level 116 can be formed over or on the plug 206. In some embodiments, the first conductive level 116 can be made from a material that offers a low resistance to the passage of electrical current, such as a metal, a semiconducting material, or a combination thereof. In other embodiments, the first conductive level 116 can be made from copper (Cu). It will be appreciated by those skilled in the art that an optional barrier layer can be deposited before deposition of the first conductive level 116 to promote adhesion and/or prevent electromigration or intermixing of materials above and below the barrier layer. In some embodiments, the barrier layer may include refractory metals, such as, but not limited to, tantalum (Ta), tungsten (W), titanium (Ti), or a combination thereof.

By way of example, the first conductive level 116 may include either of the first conductive trace 112 or the second conductive trace 114 (both of FIG. 1) depending upon vertically adjacent conductive layers, but not both.

It will be appreciated by those skilled in the art that the first conductive level 116 and the second dielectric layer 300 can be planarized by a chemical mechanical planarization process, for example.

Figure 4:
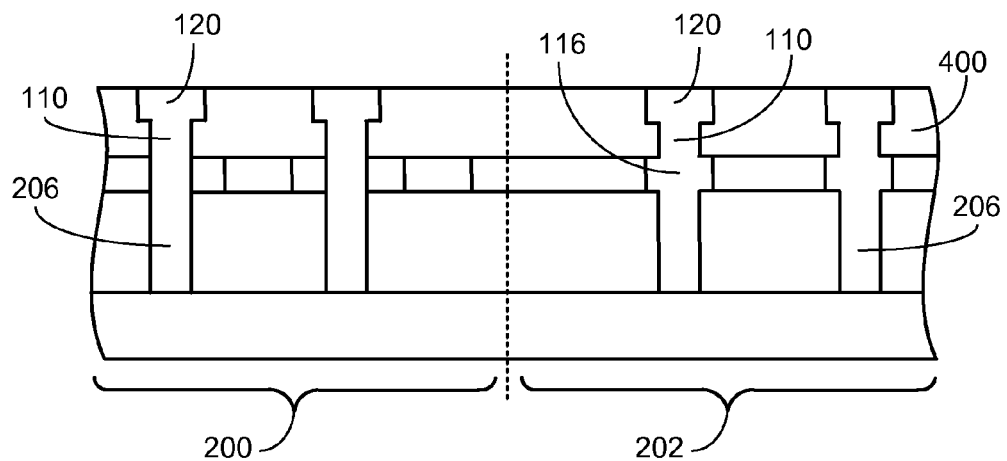
FIG. 4 is the structure of FIG. 3 after forming an M2 level.

Referring now to FIG. 4, therein is shown the structure of FIG. 3 after forming the second conductive level 120. In some embodiments, an additional conductive layer, such as the second conductive level 120 can be formed within a third dielectric layer 400, such as an interlayer dielectric. In such cases the third dielectric layer 400 may include an oxide, a nitride, or a combination thereof.

Within the first region 200, the second conductive level 120 can be formed over and connected to the plug 206 by the interconnect 110, and within the second region 202, the second conductive level 120 can be formed over the first conductive level 116 and connected by the interconnect 110. By way of example, the second conductive level 120 and the interconnect 110 can be made from a material that offers a low resistance to the passage of electrical current, such as a metal, a semiconducting material, or a combination thereof. In some embodiments, the second conductive level 120 and the interconnect 110 can be made from copper (Cu). It will be appreciated by those skilled in the art that an optional barrier layer can be deposited before deposition of the second conductive level 120 and the interconnect 110 to promote adhesion and/or prevent electromigration or intermixing of materials above and below the barrier layer. In some embodiments, the barrier layer may include refractory metals, such as, but not limited to, tantalum (Ta), tungsten (W), titanium (Ti), or a combination thereof.

By way of example, the second conductive level 120 may include either of the first conductive trace 112 or the second conductive trace 114 (both of FIG. 1) depending upon vertically adjacent conductive layers, but not both.

It will be appreciated by those skilled in the art that the second conductive level 120 and the third dielectric layer 400 can be planarized by a chemical mechanical planarization process, for example.

Figure 5:
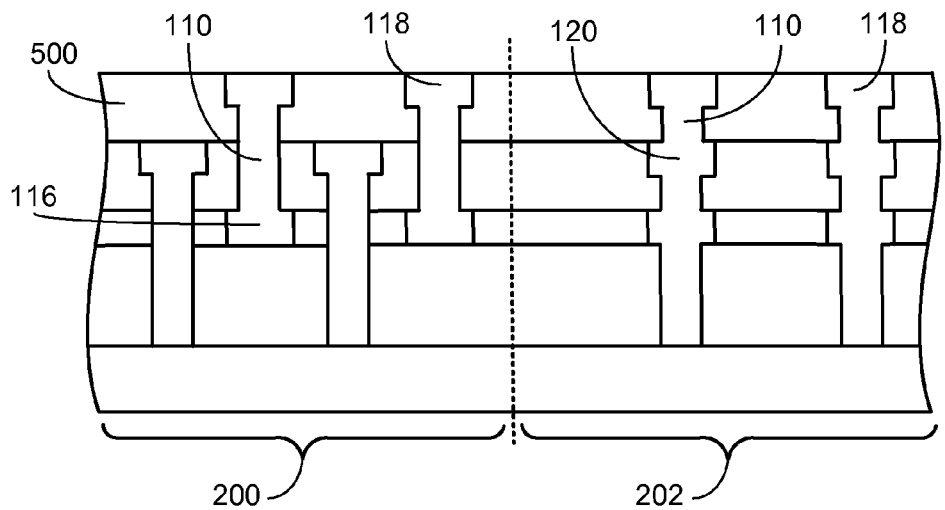
FIG. 5 is the structure of FIG. 4 after forming an M3 level.

Referring now to FIG. 5, therein is shown the structure of FIG. 4 after forming the third conductive level 118. In some embodiments, an additional conductive layer, such as the third conductive level 118 can be formed within a fourth dielectric layer 500, such as an interlayer dielectric. In such cases, the fourth dielectric layer 500 may include an oxide, a nitride, or a combination thereof.

Within the first region 200, the third conductive level 118 can be formed over and connected to the first conductive level 116 by the interconnect 110, and within the second region 202, the third conductive level 118 can be formed over the second conductive level 120 and connected by the interconnect 110. By way of example, the third conductive level 118 and the interconnect 110 can be made from a material that offers a low resistance to the passage of electrical current, such as a metal, a semiconducting material, or a combination thereof. In some embodiments, the third conductive level 118 and the interconnect 110 can be made from copper (Cu). It will be appreciated by those skilled in the art that an optional barrier layer can be deposited before deposition of the third conductive level 118 and the interconnect 110 to promote adhesion and/or prevent electromigration or intermixing of materials above and below the barrier layer. In some embodiments, the barrier layer may include refractory metals, such as, but not limited to, tantalum (Ta), tungsten (W), titanium (Ti), or a combination thereof.

Notably, the third conductive level 118 is connected to the first conductive level 116 by the interconnect 110 passing through the second conductive level 120 without contacting the second conductive trace 114 within the first region 200.

By way of example, the third conductive level 118 may include either of the first conductive trace 112 or the second conductive trace 114 (both of FIG. 1) depending upon vertically adjacent conductive layers, but not both.

It will be appreciated by those skilled in the art that the third conductive level 118 and the fourth dielectric layer 500 can be planarized by a chemical mechanical planarization process, for example.

Figure 6:
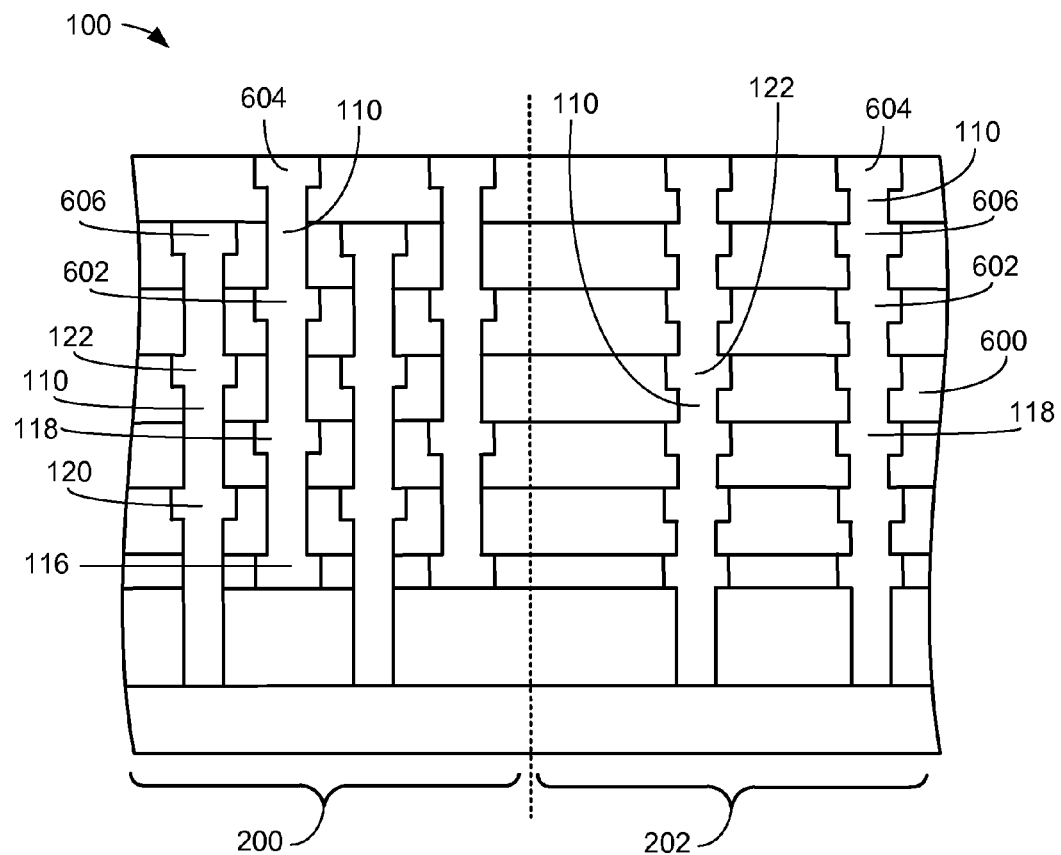
FIG. 6 is the structure of FIG. 5 after further processing.

Referring now to FIG. 6, therein is shown the structure of FIG. 5 after further processing. In some embodiments, an additional conductive layer, such as the fourth conductive level 122, can be formed within a fifth dielectric layer 600, such as an interlayer dielectric. In such cases, the fifth dielectric layer 600 may include an oxide, a nitride, or a combination thereof.

Within the first region 200, the fourth conductive level 122 can be formed over and connected to the second conductive level 120 by the interconnect 110, and within the second region 202, the fourth conductive level 122 can be formed over the third conductive level 118 and connected by the interconnect 110. By way of example, the fourth conductive level 122 and the interconnect 110 can be made from a material that offers a low resistance to the passage of electrical current, such as a metal, a semiconducting material, or a combination thereof. In some embodiments, the fourth conductive level 122 and the interconnect 110 can be made from copper (Cu). It will be appreciated by those skilled in the art that an optional barrier layer can be deposited before deposition of the fourth conductive level 122 and the interconnect 110 to promote adhesion and/or prevent electromigration or intermixing of materials above and below the barrier layer. In some embodiments, the barrier layer may include refractory metals, such as, but not limited to, tantalum (Ta), tungsten (W), titanium (Ti), or a combination thereof.

Notably, the fourth conductive level 122 is connected to the second conductive level 120 by the interconnect 110 passing through the third conductive level 118 without contacting the first conductive trace 112, of FIG. 1, within the first region 200.

By way of example, the fourth conductive level 122 may include either of the first conductive trace 112 or the second conductive trace 114 (both of FIG. 1) depending upon vertically adjacent conductive layers, but not both.

Additionally, it will be appreciated by those skilled in the art that within the first region 200 additional dielectric layers and additional odd numbered conductive layers (e.g., a fifth conductive level 602 and a seventh conductive level 604) can be formed over and connected to previous odd numbered conductive layers (e.g., the first conductive level 116 and the third conductive level 118) by the interconnect 110, while additional even numbered conductive layers (e.g., a sixth conductive level 606) can be formed over and connected to previous even numbered conductive layers (e.g., the second conductive level 120 and the fourth conductive level 122) by the interconnect 110.

Moreover, it will be appreciated by those skilled in the art that within the second region 202 additional dielectric layers and odd numbered conductive layers (e.g., the fifth conductive level 602 and the seventh conductive level 604) and additional even numbered conductive layers (e.g., the sixth conductive level 606) can be formed over and sequentially connected by the interconnect 110 to previous even or odd numbered conductive layers within the second region 202 as required by the design of the integrated circuit system 100.

Furthermore, it will be appreciated by those skilled in the art that that an optional barrier layer can be deposited before deposition of the fifth conductive level 602, the sixth conductive level 606, the seventh conductive level 604, and the interconnect 110 to promote adhesion and/or prevent electromigration or intermixing of materials above and below the barrier layer.

Although the present embodiment depicts seven of the conductive layers it will be appreciated by those skilled in the art that more or fewer of the conductive layers may be formed in accordance with the design specifications of the integrated circuit system 100.

Moreover, it will be appreciated by those skilled in the art that each of the conductive layer and the dielectric layer can be planarized by a chemical mechanical planarization process, for example, before deposition of another of the dielectric layer and the conductive layer.

Figure 7:
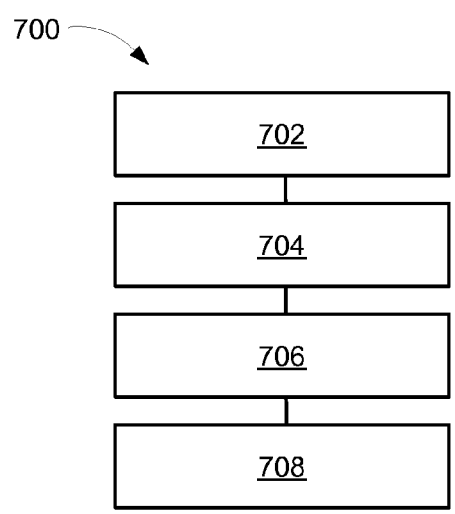
FIG. 7 is a flow chart of an integrated circuit system for an integrated circuit system in accordance with an embodiment of the present invention.

Referring now to FIG. 7, therein is shown a flow chart of an integrated circuit system 700 for the integrated circuit system 100 in accordance with an embodiment of the present invention. The integrated circuit system 700 includes providing a substrate including front-end-of-line circuitry in a block 702; forming a first conductive level including a first conductive trace over the substrate in a block 704; forming a second conductive level spaced apart from the first conductive level and including a second conductive trace in a block 706; and connecting the first conductive level to a third conductive level with a viabar that passes through the second conductive level without contacting the second conductive trace in a block 708.

It has been discovered that the present invention thus has numerous aspects. One such aspect is that the present invention can increase the capacitance density of a VPPCAP structure.

Another aspect is that the present invention permits the use of sub-design rule space between conductive traces without breaking the design rule at the layer level.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the integrated circuit system of the present invention furnishes important and heretofore unknown and unavailable solutions, capabilities, and functional aspects for improving the capacitance density of a VPPCAP structure. The resulting processes and configurations are straightforward, cost-effective, uncomplicated, highly versatile and effective, can be implemented by adapting known technologies, and are thus readily suited for efficiently and economically manufacturing integrated circuit package devices.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations, which fall within the scope of the included claims. All matters hithertofore set forth herein or shown in the accompanying drawings are to be interpreted in an illustrative and non-limiting sense.

What is claimed is:

1. A method of manufacturing an integrated circuit system comprising:
providing a substrate including front-end-of-line circuitry;
forming a first conductive layer including adjacent first conductive traces over the substrate;
forming a viabar with a horizontal via length at least twice as long as a horizontal via width to separate horizontally the adjacent first conductive traces in the first conductive layer;
forming a second conductive layer spaced apart from and not overlapping the first conductive layer, the second conductive layer including adjacent second conductive traces separated horizontally by another of the viabar; and
connecting third conductive layer to the first conductive layer by one of the viabar separating the adjacent second conductive traces, the viabar connecting the first conductive layer and the third conductive layer passing through the second conductive layer without contacting the adjacent second conductive traces as part of a vertical parallel plate capacitor structure.

2. The method as claimed in claim 1 wherein:
forming the second conductive layer spaced apart from the first conductive layer includes offsetting the second conductive traces within the second conductive layer vertically and horizontally from the first conductive traces within the first conductive layer.

3. The method as claimed in claim 1 wherein:
forming the first conductive traces and the second conductive traces include forming the first conductive traces of a first polarity and forming the second conductive traces of a second polarity.

4. The method as claimed in claim 1 wherein:
connecting the first conductive layer to the third conductive layer includes forming a first conductive plate.

5. The method as claimed in claim 1 further comprising:
connecting the second conductive layer to a fourth conductive by another of the viabar passing through the third conductive layer without contacting the first conductive traces within the third conductive layer.

6. A method for manufacturing an integrated circuit system comprising:
providing a substrate including a first region and a second region formed over the substrate, the substrate including front-end-of-line circuitry;
forming a first conductive layer including adjacent first conductive traces over the substrate;
forming a viabar with a horizontal via length at least twice as long as a horizontal via width to separate horizontally the adjacent first conductive traces in the first conductive layer;
forming a second conductive layer spaced apart from and not overlapping the first conductive layer, the second conductive layer including adjacent second conductive traces separated horizontally by another of the viabar;
forming a third conductive layer including the adjacent first conductive traces over the first conductive layer and connected to the first conductive layer by one of the viabar separating the adjacent second conductive traces to form a first conductive plate within the first region as part of a vertical parallel plate capacitor structure, the viabar connecting the first conductive layer and the third conductive layer passing through the second conductive layer without contacting the adjacent second conductive traces; and
forming a fourth conductive layer including the second conductive traces over the second conductive layer and connected to the second conductive layer by another of a viabar to form a second conductive plate within the first region.

7. The method as claimed in claim 6 wherein:
forming the first conductive plate and the second conductive plate includes forming the first conductive plate adjacent the second conductive plate.

8. The method as claimed in claim 6 wherein:
forming the first conductive plate and the second conductive plate includes forming the first conductive plate and the second conductive plate of opposite polarities.

9. The method as claimed in claim 6 wherein:
forming the first conductive plate and the second conductive plate includes forming the vertical parallel plate capacitor structure.

10. The method as claimed in claim 6 further comprising:
forming the second conductive traces spaced in-between and over two of the first conductive traces.

11. An integrated circuit system comprising:
a substrate including front-end-of-line circuitry;
a first conductive layer including adjacent first conductive traces over the substrate;
a viabar with a horizontal via length at least twice as long as a horizontal via width separating horizontally the adjacent first conductive traces in the first conductive layer;
a second conductive layer spaced apart from and not overlapping the first conductive layer, the second conductive layer including adjacent second conductive traces separated horizontally by another of the viabar; and
a third conductive layer connected to the first conductive layer by one of the viabar separating the adjacent second conductive traces, the viabar connecting the first conductive layer and the third conductive layer passing through the second conductive layer without contacting the adjacent second conductive traces as part of a vertical parallel plate capacitor structure.

12. The system as claimed in claim 11 wherein:
the second conductive traces within the second conductive layer are vertically and horizontally offset from the first conductive traces within the first conductive layer.

13. The system as claimed in claim 11 wherein:
the first conductive traces include a first polarity and the second conductive traces include a second polarity.

14. The system as claimed in claim 11 wherein:
the first conductive layer, the third conductive layer and the viabar separating the adjacent second conductive traces form a first conductive plate.

15. The system as claimed in claim 14 further comprising:
a fourth conductive layer connected to the second conductive layer by another of the viabar passing through the third conductive layer without contacting the first conductive traces within the third conductive layer, wherein the second conductive layer, the fourth conductive layer and the viabar passing through the third conductive layer form a second conductive plate.

16. The system as claimed in claim 15 wherein:
the first conductive plate is adjacent the second conductive plate.

17. The system as claimed in claim 15 wherein:
the first conductive plate is a first polarity and the second conductive plate is a second polarity.

18. The system as claimed in claim 15 wherein:
the first conductive plate and the second conductive plate form the vertical parallel plate capacitor structure.

19. The system as claimed in claim 11 wherein:
one of the second conductive trace is in-between and over two of the first conductive trace to achieve sub-design rule spacing.

20. The system as claimed in claim 11 wherein:
the substrate includes a first region with the vertical parallel plate capacitor structure and a second region with an interconnect area.

* * * * *